(12) United States Patent
Ren et al.

(10) Patent No.: US 10,064,284 B2
(45) Date of Patent: Aug. 28, 2018

(54) DRILLING METHOD FOR PCBS WITH HIGH HOLE POSITION PRECISION

(71) Applicants: GUANGZHOU FASTPRINT CIRCUIT TECH CO., LTD., Guangzhou (CN); SHENZHEN FASTPRINT CIRCUIT TECH CO., LTD., Shenzen (CN); YIXING SILICON VALLEY ELECTRONICS TECHNOLOGY CO., LTD., Yixing (CN)

(72) Inventors: Xiaolang Ren, Guangzhou (CN); Bei Chen, Guangzhou (CN); Zhijun Zeng, Guangzhou (CN); Wenjiao Xie, Guangzhou (CN)

(73) Assignees: YIXING SILICON VALLEY ELECTRONICS TECHNOLOGY CO., LTD., Yixing (CN); GUANGZHOU FASTPRINT CIRCUIT TECH CO., LTD., Guangzhou (CN); SHENZHEN FASTPRINT CIRCUIT TECH CO., LTD., Shenzen (CN)

( * ) Notice: Subject to any disclaimer, the term of this patent is extended or adjusted under 35 U.S.C. 154(b) by 0 days.

(21) Appl. No.: 15/112,636

(22) PCT Filed: Dec. 19, 2014

(86) PCT No.: PCT/CN2014/094352
§ 371 (c)(1),
(2) Date: Jul. 19, 2016

(87) PCT Pub. No.: WO2015/109908
PCT Pub. Date: Jul. 30, 2015

(65) Prior Publication Data
US 2016/0338203 A1    Nov. 17, 2016

(30) Foreign Application Priority Data

Jan. 21, 2014  (CN) .......................... 2014 1 0028529

(51) Int. Cl.
*H05K 3/00* (2006.01)
*B23B 35/00* (2006.01)
(Continued)

(52) U.S. Cl.
CPC .......... *H05K 3/0047* (2013.01); *B23B 35/00* (2013.01); *B23B 41/02* (2013.01);
(Continued)

(58) Field of Classification Search
CPC ......... B23B 41/14; B23B 41/16; B23B 41/00; B23B 35/00; B23B 2220/00; B23B 2220/24; B23B 2220/44; B23B 2220/445
See application file for complete search history.

(56) References Cited

U.S. PATENT DOCUMENTS 3,948,701 A * 4/1976 Fasbender .............. H01B 3/002
156/155
4,383,785 A * 5/1983 Rice ........................ B23B 51/02
125/20
(Continued)

FOREIGN PATENT DOCUMENTS

CN    1321569 A    11/2001
CN    1575097 A    2/2005
(Continued)

OTHER PUBLICATIONS

International Search Report and Written Opinion for International Application No. PCT/CN2014/094352; dated Mar. 17, 2015 (15 pages).
(Continued)

*Primary Examiner* — Daniel Howell
*Assistant Examiner* — Yasir Diab
(74) *Attorney, Agent, or Firm* — Kagan Binder, PLLC

(57) ABSTRACT

Disclosed is a drilling method for PCBs with high hole position precision, comprising: step 1 of fixing a PCB on a workbench; step 2 of pre-drilling a to-be-drilled portion of the PCB by using a short-blade drilling tool; and step 3 of
(Continued)

deeply drilling the to-be-drilled portion which has been machined in step 2 by using along-blade drilling tool. The PCB is fixed in step 1 to prevent the PCB from moving during drilling which otherwise would affect the drilling precision; the to-be-drilled portion of the PCB is pre-drilled by using a short-blade drilling tool in step 2, and the short-blade drilling tool has a higher rigidity than along-blade drilling tool and thus will not easily slide at the moment of contacting the surface of the PCB; and the to-be-drilled portion which has been machined in step 2 is deep drilled by using the long-blade drilling tool in step 3, and the long-blade drilling tool has reduced sliding upon entry, thus guaranteeing the entry alignment of the long-blade drilling tool in the case of deep drilling, so that the drilled hole meets the requirement of high hole position precision for PCBs.

6 Claims, 5 Drawing Sheets

(51) Int. Cl.
    *B23B 41/02*       (2006.01)
    *H05K 13/00*     (2006.01)
    *B23B 41/14*       (2006.01)
    *B23B 41/16*       (2006.01)

(52) U.S. Cl.
    CPC .......... *H05K 13/0015* (2013.01); *B23B 41/14* (2013.01); *B23B 41/16* (2013.01); *B23B 2220/445* (2013.01); *H05K 2203/0207* (2013.01)

(56) References Cited

U.S. PATENT DOCUMENTS

| | | | | |
|---|---|---|---|---|
| 4,929,370 A | * | 5/1990 | Hatch | H05K 3/0047 408/1 R |
| 5,172,472 A | * | 12/1992 | Lindner | H05K 3/326 174/266 |
| 5,584,617 A | * | 12/1996 | Houser | B23B 51/02 408/1 R |
| 6,000,886 A | * | 12/1999 | Washio | B23B 35/005 408/1 R |
| 2002/0029906 A1 | | 3/2002 | Echigo et al. | |
| 2004/0086741 A1 | * | 5/2004 | Japp | B23B 35/00 428/626 |
| 2005/0019122 A1 | | 1/2005 | Kado et al. | |
| 2005/0112344 A1 | * | 5/2005 | Redfern | B23B 35/00 428/213 |
| 2006/0102383 A1 | | 5/2006 | Cha et al. | |
| 2006/0258188 A1 | | 11/2006 | Daikuhara et al. | |
| 2009/0214308 A1 | * | 8/2009 | Redfern | B23B 35/005 408/1 R |

FOREIGN PATENT DOCUMENTS

| | | |
|---|---|---|
| CN | 101352858 A | 1/2009 |
| CN | 101692757 A | 4/2010 |
| CN | 101862843 A | 10/2010 |
| CN | 102036492 A | 4/2011 |
| CN | 102601406 A | 7/2012 |
| CN | 202364477 U | 8/2012 |
| CN | 102773520 A | 11/2012 |
| CN | 202640461 U | 1/2013 |
| CN | 202656228 U | 1/2013 |
| CN | 103170995 A | 6/2013 |
| CN | 103302329 A | 9/2013 |
| CN | 203357536 U | 12/2013 |
| CN | 103786189 A | 5/2014 |

OTHER PUBLICATIONS

Search Report & First Office Action for Priority Chinese Patent Application No. 201410028529.4, dated Mar. 11, 2015 (13 pages).
Supplementary Search Report & Second Office Action for Priority Chinese Patent Application No. 201410028529.4, dated Oct. 20, 2015 (13 pages).
Third Office Action for Priority Chinese Patent Application No. 201410028529.4, dated Mar. 9, 2016 (7 pages).

* cited by examiner

DRILLING METHOD FOR PCBS WITH HIGH HOLE POSITION PRECISION

FIELD

The present disclosure generally relates to a PCB manufacturing technology, and more particularly, to a drilling method for PCBs with high hole position precision.

BACKGROUND

With the development of electronic industry, the printed circuit boards (PCBs) tend to have thicker board, smaller holes, and denser wiring. It is thus required to continually improve the process capability of manufacturing the printed circuit board to meet technological developments. Hole position precision of the drilling of PCB is one of the most important process capabilities, which directly affects the application of new technologies and new products, such as miniaturization, high thickness-diameter ratio, high layers and small spacing of Ball Grid Array (BGA). At present, most of PCB manufacturers adopt the one or more of the following to meet the technology requirements for high hole position precision: a high precision drilling machine, a special drilling tool, a special base or cover plate, and a process of drilling in both normal and reverse directions. However, all the above measures have the disadvantages of high cost and limited effect in improvement, which limits the popularization and application of these measures.

SUMMARY

Based on the above, it is an objective of the present disclosure to provide a drilling method for PCBs with high hole position precision to overcome the defects in the prior art. The drilling method provided here not only can meet the requirement of high hole position precision for PCB, but also is simple in operation, and low in cost.

The specific technical solution is as below:

a drilling method for PCBs with high hole position precision, including:

step 1, fixing the PCB on a workbench;

step 2, performing a pre-drill into a to-be-drilled portion of the PCB using a short-blade drilling tool; and step 3, performing a deep drill into the to-be-drilled portion which has been processed in the step 2 using a long-blade drilling tool.

The technical solution includes the following further features.

The short-blade drilling tool in the step 2 has a blade length of 1 mm to 3 mm.

The pre-drilling in the step 2 forms a hole with a depth of 0.4 mm to 0.6 mm.

After finishing the pre-drilling in the step 2, replace the short-blade drilling tool in a drilling machine by the long-blade drilling tool to perform the step 3, while keeping the position of the PCB unchanged.

In the step 1, a bakelite plate is mounted on the workbench; the bakelite plate is drilled into to make a location hole; a pin is inserted into the location hole; and a base plate and the PCB both provided with location holes are aligned with the pin and mounted on the workbench sequentially.

In the step 1, the pin exceeds a length less than or equal to 1 mm above an uppermost layer of the PCB.

In the step 1, the uppermost layer of the PCB is covered by a cover plate, and edges of the cover plate are glued by a masking tape.

In the step 1, the cover plate covering on the uppermost layer of the PCB is a coated aluminum sheet.

The advantages or principles of the above technical solution are set forth below.

For the drilling method for PCBs with high hole position precision according to the present disclosure, the PCB is fixed in the step 1 to avoid moving during drilling which otherwise would affect the drilling precision; the to-be-drilled portion of the PCB is pre-drilled into by using a short-blade drilling tool in the step 2 so that the to-be-drilled portion of the PCB is drilled into to make a hole with a relatively shallow depth, and; since the short-blade drilling tool has a higher rigidity than along-blade drilling tool and thus will not easily slide at the moment of contacting the surface of the PCB, this greatly reduces the position offset of the relatively shallow hole pre-drilled by the short-blade drilling tool; and the to-be-drilled portion which has been machined in the step 2 is deeply drilled into by using the long-blade drilling tool in step 3. Since there is a relatively shallow hole pre-drilled in the step 2, the long-blade drilling tool has a reduced amount of lateral sliding upon entering drilling, ensuring the entering drilling alignment of the long-blade drilling tool in the case of deep drilling, so that the drilled hole meets the requirement of high hole position precision for a PCB. Compared with the traditional method to achieve high hole position precision, the method according to the present disclosure is simple in operation, and low in cost.

DESCRIPTION OF REFERENCE SIGNS OF APPENDED DRAWINGS

100 workbench; 200 bakelite plate; 300 base plate; 400 PCB; 500 cover plate; 600 pin; 700 short-blade drilling tool; and 800 long-blade drilling tool.

DETAILED DESCRIPTION OF THE PREFERRED EMBODIMENTS

The present disclosure may be best understood by reference to the following description taken in conjunction with the accompanying drawings.

Referring to FIG. 1 to FIG. 4, a drilling method for PCBs with high hole position precision is provided, including the following steps:

step 1, fixing the PCB on a workbench;

step 2, performing pre-drill into a to-be-drilled portion of the PCB using a short-blade drilling tool; and step 3, performing deep drill into the to-be-drilled portion which has been processed in the step 2 using a long-blade drilling tool.

For the drilling method for PCBs with high hole position precision in this embodiment, the PCB is fixed in the step 1 to avoid moving during drilling which otherwise would affect the drilling precision; the to-be-drilled portion of the PCB is pre-drilled by using a short-blade drilling tool in the step 2 so that the to-be-drilled portion of the PCB is drilled to have a hole with a relatively shallow depth, and since the short-blade drilling tool has a higher rigidity than a long-blade drilling tool and thus will not easily slide at the moment of contacting the surface of the PCB, this greatly reduces the displacement error of the relatively shallow hole pre-drilled by the short-blade drilling tool; and the to-be-drilled portion which has been machined in the step 2 is deeply drilled by using the long-blade drilling tool in step 3. Since there is a relatively shallow hole pre-drilled in the step 2, the long-blade drilling tool has a reduced amount of lateral sliding upon entering drilling, ensuring the entering drilling alignment of the long-blade drilling tool in the case of deep drilling, so that the drilled hole meets the requirement of high hole position precision for a PCB. Compared with the traditional method to achieve high hole position precision, the method in this embodiment is simple in operation, and low in cost.

After finishing the pre-drilling in the step 2, replace the short-blade drilling tool in a drilling machine by the long-blade drilling tool to perform the step 3, while keeping the position of the PCB unchanged. The position offset of the hole on the PCB may be reduced by keeping the position of the PCB unchanged to ensure the position where the long-blade drilling tool deeply drills and the position where the short-blade drilling tool pre-drills overlap with each other.

Figure 5:
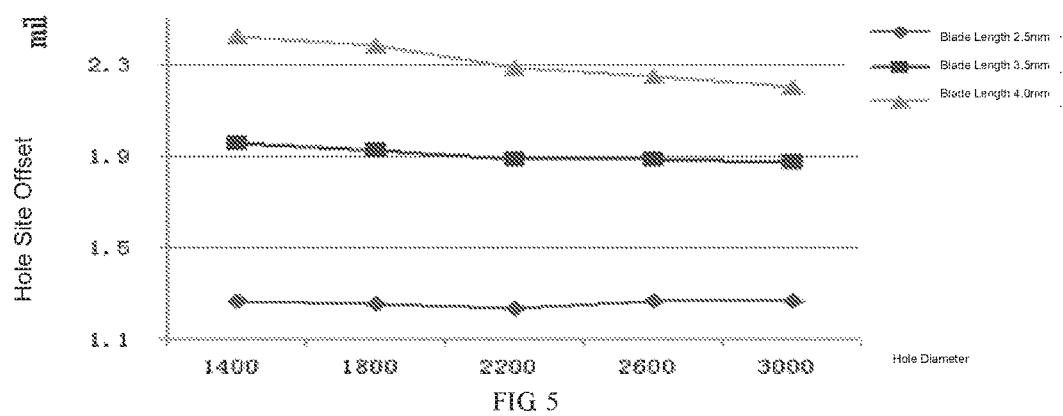
FIG. 5 is a schematic diagram showing comparisons between position offsets of hole drilled by drilling tools of different blade lengths under the same conditions according to one embodiment of the present disclosure.

The main reason for the position offset of the drilling hole is described below. The drilling tool may be driven by a spindle of the drilling machine to drill at a certain feed speed, and a sideslip force in the horizontal direction (X/Y direction), caused by the vertical center line of the spindle being not completely perpendicular to the horizontal center line of the produced board and the dynamic offset of the spindle, may be applied on the drilling tool, so that the drill tip of the drilling tool may slip in an instant. In addition, since the drilling tool is completely constrained in the X/Y direction after drilling into the board (that is, there is infinite resistance in the horizontal direction), the drilling tool may drill down into the board at an angle with respect to the vertical direction formed on the moment of the drilling tool contacting the board. Finally, the offset on the back side of the PCB is larger than that on the front side of the PCB. As shown in FIG. 5, the longer the blade of the drilling tool is, the larger the position offset of the hole is, when drilling under the same condition.

Figure 1:
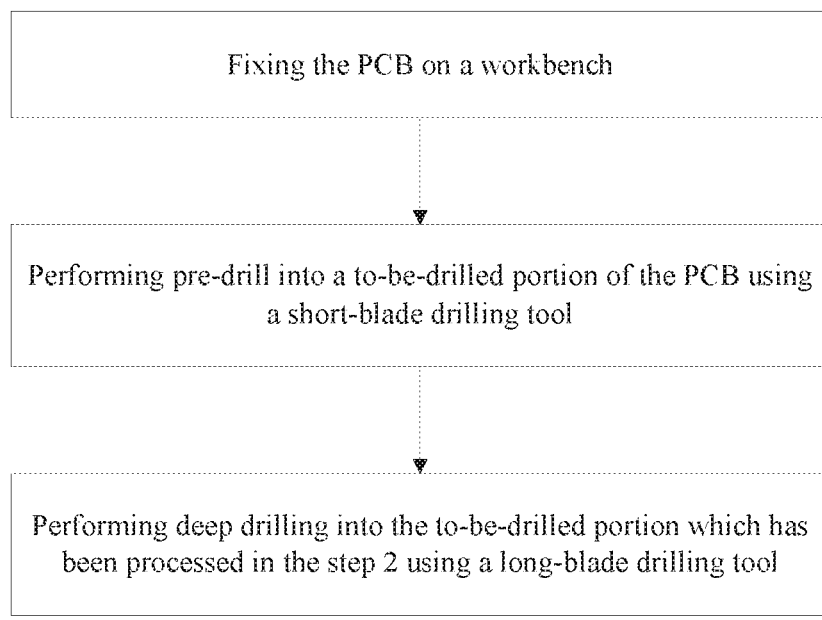
FIG. 1 is a flow diagram showing a for PCBs with high hole position precision according to one embodiment of the present disclosure.
Figure 2:
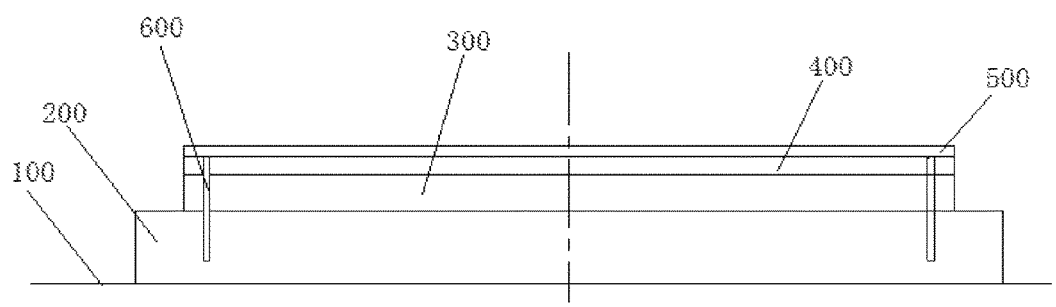
FIG. 2 is a schematic diagram showing a PCB fixed on a workbench according to one embodiment of the present disclosure.
Figure 3:
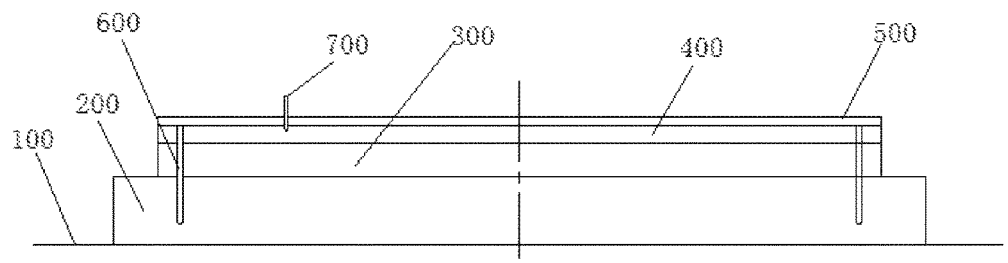
FIG. 3 is a schematic diagram showing pre-drilling a to-be-drilled portion of the PCB by using a short-blade drilling tool according to one embodiment of the present disclosure.
Figure 4:
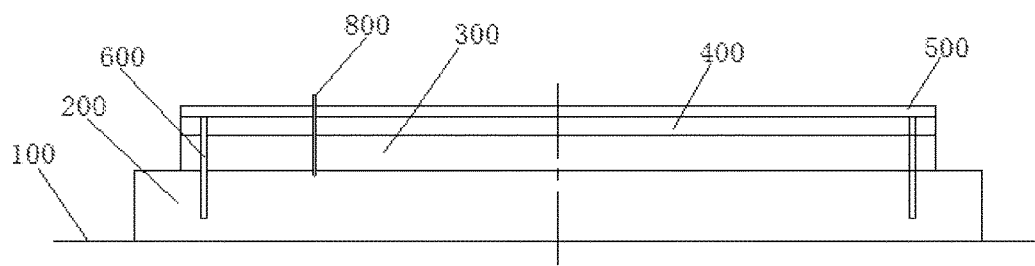
FIG. 4 is a schematic diagram showing deeply drilling the to-be-drilled portion by using a long-blade drilling tool according to the embodiment of the present disclosure.

Referring to FIG. 1, in step 1, a bakelite plate 200 is mounted on the workbench 100; the bakelite plate 200 is drilled into to have a location hole; a pin 600 is inserted into the location hole; and abase plate 300 and the PCB 400 both provided with location holes are aligned with the pin 600 and mounted on the workbench 100 sequentially. The pin 600 exceeds a length less than or equal to 1 mm above an uppermost layer of the PCB 400. The uppermost layer of the PCB 400 is covered by a cover plate 500, the cover plate 500 is a coated aluminum sheet, and edges of the cover plate 500 are glued by a masking tape. In this way, the PCB can be positioned by the pin 600 which is provided within the location hole on the bakelite plate 200. The location hole is drilled on the bakelite plate by the drilling machine calling location hole program from the drilling program (with a location method using round holes of different apertures, a location method in which the groove fits the round hole, a position matching pasting location method, and a X-Ray drilling target location method). The drilling tool may contact the cover plate firstly at the moment of drilling down to the board, by providing the cover plate 500 on the uppermost layer of the PCB 400, and gluing the edges of the cover plate 500 with a masking tape. The friction force applied on the drilling tool by the cover plate may counteract the sideslip force applied on the drilling tool in the horizontal direction, so that the drilling tool can be quickly drilling in the cover plate in an instant, and carry away the cutting heat and drilling cuttings. The coated aluminum sheet is used as the cover plate, which has a friction coefficient larger than that of the normal aluminum sheet, so it can effectively reduce the impact of the sliding during the drilling tooling drilling into the board, In this embodiment, the short-blade drilling tool in the step 2 has a blade length of 1 mm to 3 mm. Such design not only ensures the strength required by drilling, but also avoids the sliding during the pre-drilling as much as possible which may affects the drilling precision using the short-blade drilling tool.

In this embodiment, the pre-drilling in the step 2 forms a hole with a depth of 0.4 mm to 0.6 mm. In this way, a hole with an appropriate depth may be formed by the pre-drilling using the short-blade drilling tool, which may direct the deep drilling using the long-blade drilling tool, to reduce the lateral sliding when the long-blade drilling tool enters drilling, thus guaranteeing the entering drilling alignment of the long-blade drilling tool in the case of deep drilling. This improves the hole position precision of the back side of the produced board. Pre-drilling a blind hole may be implemented in several ways including Z-axis coordinate control, CBD depth control system or pressure foot induction.

The above are embodiments of the disclosure described in detail, and should not be deemed as limitations to the scope of the present disclosure. It should be noted that variations and improvements will become apparent to those skilled in the art to which the present disclosure pertains without departing from its spirit and scope. Therefore, the scope of the present disclosure is defined by the appended claims.

The invention claimed is:

1. A drilling method for PCBs with high hole position precision, comprising:
   step 1, fixing a PCB on a workbench comprising:
      i) mounting a bakelite plate on the workbench;
      ii) drilling a location hole on the bakelite plate;
      iii) inserting a pin into the location hole; and
      iv) mounting a base plate and the PCB both provided with location holes aligned with the pin on the workbench sequentially;
   step 2, performing pre-drill into a to-be-drilled portion of the PCB using a short-blade drilling tool, wherein the short-blade drilling tool of the step 2 has a blade length of 1 mm to 3 mm; and
   step 3, performing deep drill into the to-be-drilled portion which has been processed in the step 2 using a long-blade drilling tool.

2. The drilling method of claim 1, wherein a depth of the pre-drill of the step 2 is 0.4 mm to 0.6 mm.

3. The drilling method of claim 1, further comprising, after performing the pre-drill of the step 2, replacing the short-blade drilling tool in a drilling machine with the long-blade drilling tool to perform step 3, while keeping the position of the PCB unchanged.

4. The drilling method of claim 1, wherein in the step 1, the pin exceeds a length less than or equal to 1 mm above an uppermost layer of the PCB.

5. The drilling method of claim 4, wherein in the step 1, the uppermost layer of the PCB is covered by a cover plate, and edges of the cover plate are glued by a masking tape.

6. The drilling method of claim 5, wherein in the step 1, the cover plate covering on the uppermost layer of the PCB is a coated aluminum sheet.

* * * * *